United States Patent
Park (10) Patent No.: US 12,219,764 B2
(45) Date of Patent: *Feb. 4, 2025

(54) NON-VOLATILE MEMORY DEVICE AND METHOD OF MANUFACTURING THE NON-VOLATILE MEMORY DEVICE

(71) Applicant: SK hynix Inc., Icheon-si (KR)

(72) Inventor: In Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 286 days.

This patent is subject to a terminal disclaimer.

(21) Appl. No.: 17/860,516

(22) Filed: Jul. 8, 2022

(65) Prior Publication Data

US 2022/0344369 A1 Oct. 27, 2022

Related U.S. Application Data (63) Continuation of application No. 16/830,070, filed on Mar. 25, 2020, now Pat. No. 11,387,252.

(30) Foreign Application Priority Data

Oct. 8, 2019 (KR) .................... 10-2019-0124650

(51) Int. Cl.
*H10B 43/27* (2023.01)
*G11C 16/04* (2006.01)

(52) U.S. Cl.
CPC .......... *H10B 43/27* (2023.02); *G11C 16/0483* (2013.01)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 9,496,274 B2 | 11/2016 | Pachamuthu et al. | |
| 9,530,790 B1 | 12/2016 | Lu et al. | |
| 11,387,252 B2* | 7/2022 | Park | H10B 43/27 |
| 2017/0200736 A1* | 7/2017 | Park | H10B 43/10 |
| 2017/0243885 A1 | 8/2017 | Hwang et al. | |
| 2017/0278861 A1 | 9/2017 | Sonehara et al. | |
| 2018/0269210 A1 | 9/2018 | Tezuka et al. | |
| 2018/0374868 A1* | 12/2018 | Choi | H10B 43/10 |

(Continued)

FOREIGN PATENT DOCUMENTS

| | | |
|---|---|---|
| CN | 105977257 A | 9/2016 |
| CN | 108565267 A | 9/2018 |

(Continued)

*Primary Examiner* — Christopher A Johnson
(74) *Attorney, Agent, or Firm* — WILLIAM PARK & ASSOCIATES LTD.

(57) ABSTRACT

A non-volatile memory device may include a semiconductor substrate, a stack structure and a source structure. The stack structure may be formed on the semiconductor substrate. The source structure may be formed in a slit configured to divide the stack structure. The source structure may include a sealing layer, a source liner, a gap-filling layer and a source contact pattern. The sealing layer may be formed on an inner wall of the slit. The source liner may be formed on a surface of the sealing layer and a bottom surface of the slit. The gap-filling layer may be formed in the slit. The source contact pattern may be formed on the gap-filling layer in the slit. The source contact pattern may be electrically connected with the source liner.

8 Claims, 9 Drawing Sheets

(56) References Cited

U.S. PATENT DOCUMENTS

| | | | |
|---|---|---|---|
| 2019/0067412 A1 | 2/2019 | Tessariol et al. | |
| 2019/0081052 A1* | 3/2019 | Lee | H10B 41/41 |
| 2019/0115363 A1 | 4/2019 | Choi | |
| 2019/0288000 A1* | 9/2019 | Choi | H01L 29/0649 |

FOREIGN PATENT DOCUMENTS

| | | |
|---|---|---|
| CN | 108807410 A | 11/2018 |
| KR | 1020150094097 A | 8/2015 |
| KR | 1020160087691 A | 7/2016 |
| KR | 1020190010403 A | 1/2019 |

\* cited by examiner

NON-VOLATILE MEMORY DEVICE AND METHOD OF MANUFACTURING THE NON-VOLATILE MEMORY DEVICE

CROSS-REFERENCES TO RELATED APPLICATION

This application is a continuation of U.S. patent application Ser. No. 16/830,070 filed on Mar. 25, 2020, which claims priority under 35 U.S.C. § 119(a) to Korean Application No. 10-2019-0124650 filed on Oct. 8, 2019, in the Korean Intellectual Property Office, which is incorporated herein by reference in its entirety.

BACKGROUND

1. Technical Field

Various embodiments may generally relate to a non-volatile memory device and a method of manufacturing the same, more particularly, a non-volatile memory device that may be capable of reducing a leakage current caused by a bridge of a source line structure, and a method of manufacturing the non-volatile memory device.

2. Related Art

While still being required to process massive amounts of data, the electronic products and their volumes have been gradually decreasing. Thus, it may be required to increase an integration degree of a semiconductor memory device to apply the semiconductor memory device to the electronic product. In order to increase the integration degree of the semiconductor memory device, a three-dimensional non-volatile memory device having a vertical transistor structure in place of a planer transistor structure may be proposed.

Therefore, it may be required to provide the three-dimensional memory device with the high integration degree and good electrical characteristics.

SUMMARY

In an embodiment of the present disclosure, a non-volatile memory device may include a semiconductor substrate, a stack structure and a source structure. The stack structure may be formed on the semiconductor substrate. The source structure may be formed in a slit configured to divide the stack structure. The source structure may include a sealing layer, a source liner, a gap-filling layer and a source contact pattern. The sealing layer may be formed on an inner wall of the slit. The source liner may be formed on a surface of the sealing layer and a bottom surface of the slit. The gap-filling layer may be formed in the slit. The source contact pattern may be formed on the gap-filling layer in the slit. The source contact pattern may be electrically connected with the source liner.

In an embodiment of the present disclosure, according to a method of manufacturing a non-volatile memory device, a stack structure may be formed on a semiconductor substrate having a source line region. A slit may be formed through the stack structure. A sealing layer may be formed on an inner wall of the slit. A source liner including a conductive layer may be formed on the sealing layer and a bottom surface of the slit to contact the source line region with the source liner. A gap-filling layer may be formed in the slit. A source contact pattern may be formed on the gap-filling layer in the slit.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The embodiments are described herein with reference to cross-section and/or plan illustrations of idealized embodiments. However, these embodiments should not be construed as limiting the concepts. Although a few embodiments will be shown and described, it will be appreciated by those of ordinary skill in the art that changes may be made in these embodiments without departing from the principles and spirit of the present disclosure.

Figure 1:
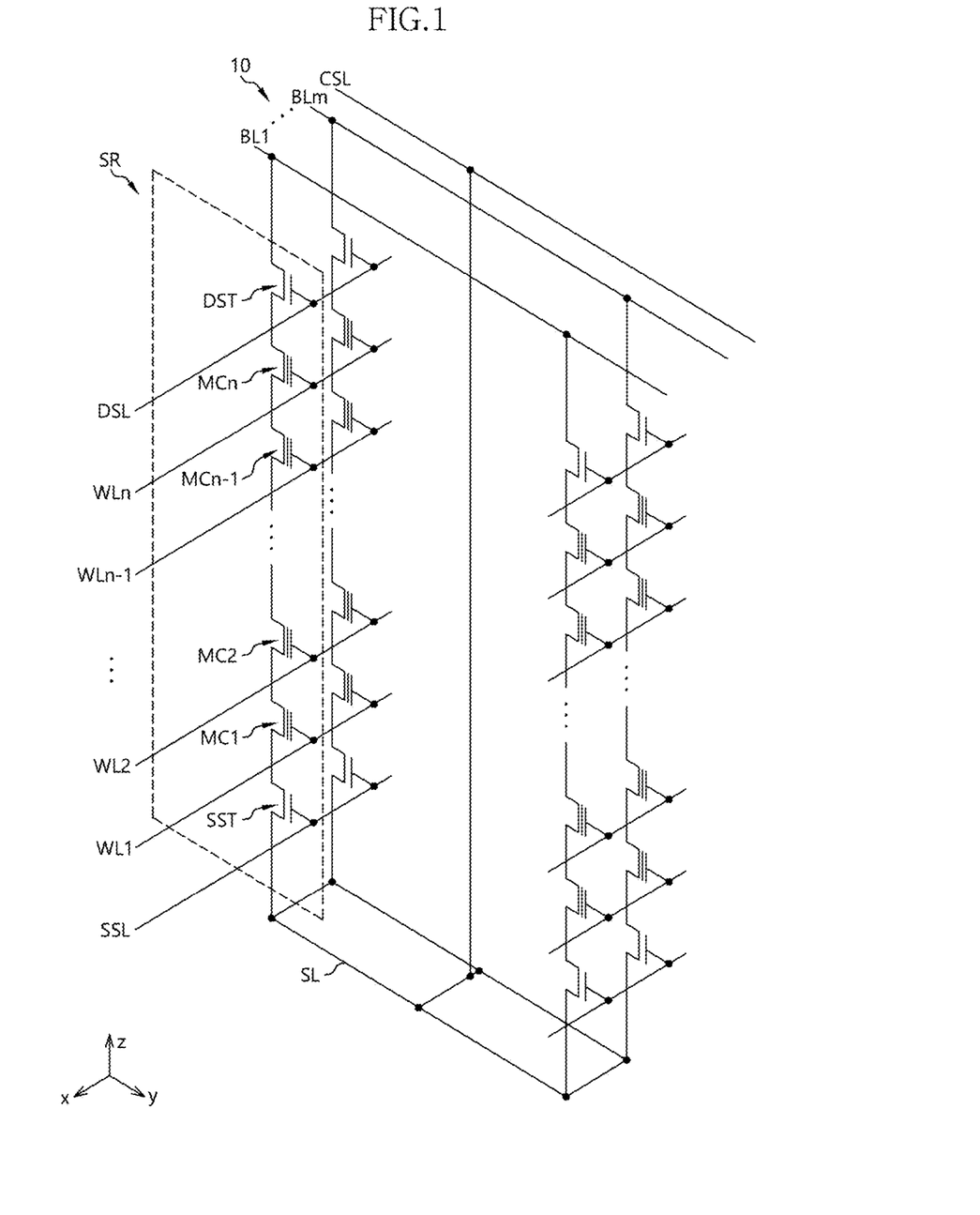
FIG. 1 is a circuit diagram illustrating memory strings of a non-volatile memory device in accordance with various embodiments.

FIG. 1 is a circuit diagram illustrating memory strings of a non-volatile memory device in accordance with various embodiments.

Referring to FIG. 1, a non-volatile memory device of various embodiments may include a memory cell array 10. The memory cell array 10 may include a plurality of memory strings SR.

Each of the memory strings SR may include a source selection transistor SST, a plurality of memory cell transistors MC1~MCn and a drain selection transistor DST serially connected with each other. For example, FIG. 1 shows one source selection transistor SST and one drain selection transistor DST. Alternatively, the memory string SR may include a plurality of the source selection transistors serially connected with each other and a plurality of the drain selection transistors serially connected with each other.

The memory strings SR may be arranged in a matrix shape along a row direction x and a column direction y to form the memory cell array 10. The memory strings SR on the same column may be connected to a same bit line. The memory strings SR on the same row may be commonly connected to gate lines SSL, WL1~WLn and DSL on the same row.

The source selection transistor SST, the memory cell transistors MC1~MCn and the drain selection transistor DST in one memory string SR may commonly share one channel layer. The memory strings SR may be arranged between bit lines BL1~BL5 and a source line SL. The gate lines SSL, WL1~WLn and DSL may be stacked between the bit lines BL1~BL5 and the source line SL. The gate lines SSL, WL1~WLn and DSL may be electrically isolated from each other.

The source selection line SSL may be used for a gate electrode of the source selection transistor SST. The word lines WL1~WLn may be used for gate electrodes of the memory cell transistors MC1~MCn. The drain selection line DSL may be used for a gate electrode of the drain selection transistor DST. The word lines WL1~WLn may be stacked parallely with each other. The source selection line SSL may be positioned under the word lines WL1~WLn. The drain selection line DSL may be arranged over the word lines WL1~WLn.

Each of the bit lines BL1~BL5 may be connected to the drain selection transistors DST of the memory string SR arranged in a corresponding column direction. For example, the memory strings SR commonly connected to one drain selection line DSL may be connected with different bit lines BL1~BL5. Thus, when one drain selection line DSL may be selected and any one of the bit lines BL1~BL5 may be selected, any one of the memory strings SR may be selected.

The source line SL may be electrically connected a common source line CSL. The source line SL may transmit a driving voltage applied to the common source line CSL to the memory strings SR. The driving voltage may be selectively transmitted to the memory strings SR in accordance with a voltage level of the source selection line SSL.

Figure 2:
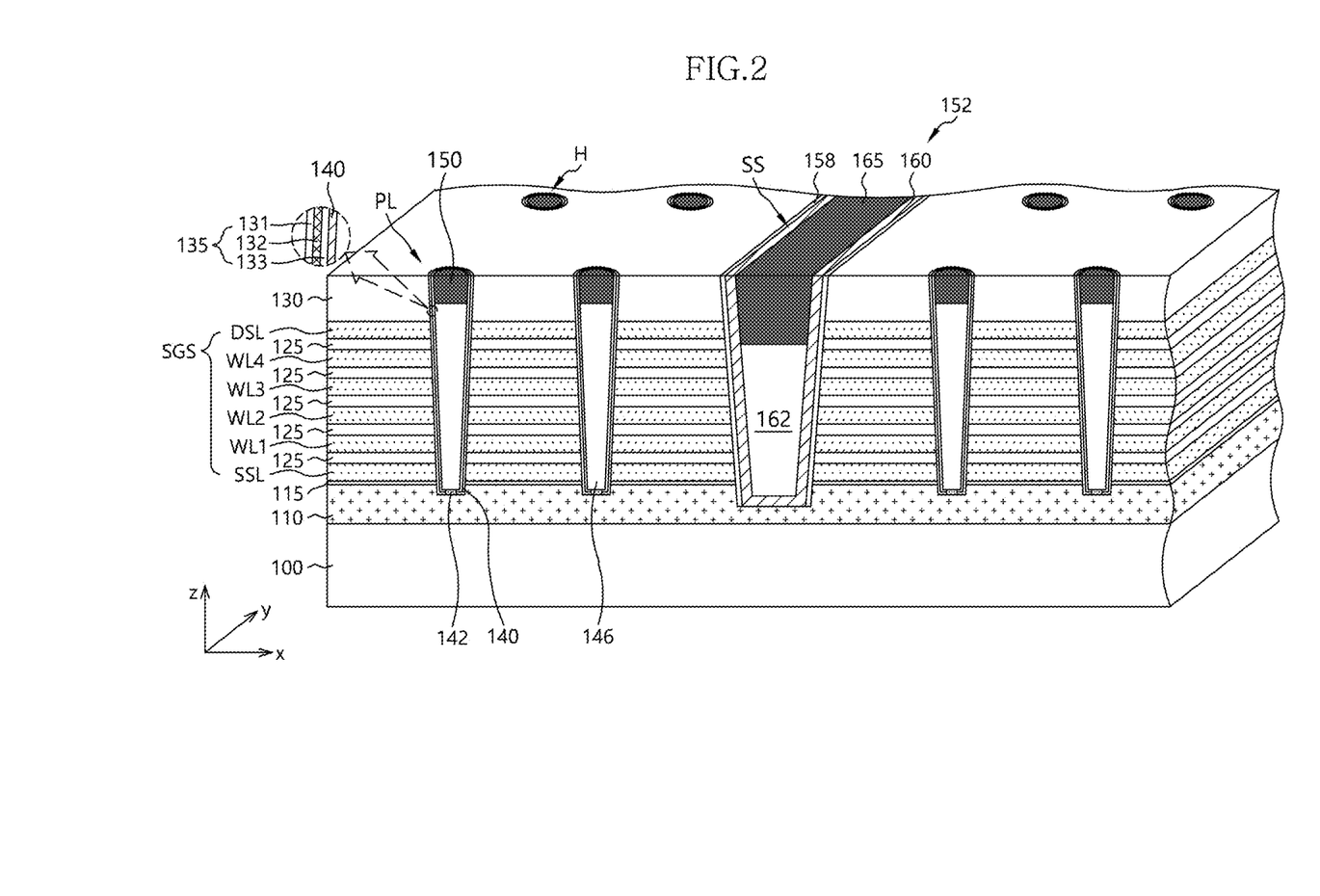
FIG. 2 is a perspective view illustrating a non-volatile memory device in accordance with embodiments.

FIG. 2 is a perspective view illustrating a non-volatile memory device in accordance with various embodiments.

Referring to FIG. 2, a non-volatile memory device of various embodiments may include a stack structure SGS, a source structure SS and a cell plug PL.

A semiconductor substrate 100 may include a silicon substrate. The semiconductor substrate 100 may include a source layer 110 such as impurity regions.

The stack structure SGS may include a plurality of the gate lines SSL, WL1~WL4 and DSL and an insulation layer 125 interposed between the gate lines SSL, WL1~WL4 and DSL. A gate insulation layer 115 may be interposed between the semiconductor substrate 100 and the stack structure SGS. An insulating interlayer 130 may be formed on the stack structure SGS. The gate insulation layer 115 and the insulating interlayer 130 may include silicon oxide layers. The insulating interlayer 130 may have a thickness greater than those of the gate insulation layer 115 and the insulation layer 125.

The gate line SSL adjacent to the semiconductor substrate 100 may correspond to a source selection line as a gate of the source selection transistor SST. The gate line DSL adjacent to the insulating interlayer 130 may correspond to a drain selection line as a gate of the drain selection transistor DST. The gate lines WL1~WL4 between the source selection line SSL and the drain selection line DSL may correspond to word lines as gates of the memory cell transistor MC1~MC4.

The source structure SS may be configured to divide the stack structure SGS into a uniform size. For example, although not depicted in drawings, the stack structure SGS may be divided into blocks by the source structure SS. The source structure SS may include a slit 152 formed through the insulating interlayer 130 and the stack structure SGS. The source layer 110 and the gate lines SSL, WL1~WL4 and DSL of the stack structure SGS may be exposed through the slit 152.

The source structure SS may include a sealing layer 158 formed on an inner wall of the slit 152. The sealing layer 158 may include a silicon oxide layer. The sealing layer 158 may block the opened gate lines SSL, WL1-WL4 and DSL. However, because the sealing layer 158 may be formed on the inner wall of the slit 152, the source layer 110 may be exposed.

The source structure SS may further include a source liner 160 formed on a surface of the sealing layer 158 and a bottom surface of the slit 152. The source liner 160 may include a conductive layer such as a metal nitride layer. For example, the source liner 160 may include a titanium nitride layer, a tungsten nitride layer, etc. The source liner 160 may have a setting thickness in accordance with a width of the slit 152. For example, the thickness of the source liner 160 may be about 1% to about 30% of a half of the width of the slit 152. The thickness of the source liner 160 may be about 10 Å to about 200 Å. Because the source liner 160 may be formed on the surface of the sealing layer 158 and the bottom surface of the slit 152, the source liner 160 may directly make contact with the source layer 110.

The source structure SS may further include a gap-filling layer 162 and a source contact pattern 165. The gap-filling layer 162 and the source contact pattern 165 may be formed in the slit 152. The gap-filling layer 162 may include a silicon oxide layer of a doped silicon layer. For example, the gap-filling layer 162 may be formed in a lower region of the slit 152. The source contact pattern 165 may be formed on the gap-filling layer 162 to fill up the slit 152. The source contact pattern 165 may electrically make contact with the source liner 160. A common source line may be formed on the source contact pattern 165. Thus, a source voltage applied to the common source line may be transmitted to the source layer 110 through the source contact pattern 165 and the source liner 160. The source liner 160 may function as to transmit the source voltage and as a protection layer for preventing the sealing layer 158 from being damaged. Therefore, a bridge between the gate lines SSL, WL1~WL4 and DSL on the sidewall of the slit 152 and the source contact pattern 165 might not be generated due to the source liner 160.

The cell plug PL may be formed in the stack structure SGS defined by the blocks in a cell string unit. The cell plug PL may include holes H formed through the insulating interlayer 130 and the stack structure SGS. The holes H may be arranged spaced apart from each other by a uniform gap in a region where a bit line may be arranged. The cell plug PL may include a memory layer 135 on an inner wall of the hole H, a channel layer 140, a connecting layer 142, a core insulation layer 146 and a capping pattern 150.

The memory layer 135 may be formed on the inner wall of the hole H. The memory layer 135 may include a blocking insulating layer 131, a data storage layer 132 and a tunnel insulating layer 133 sequentially stacked. The blocking insulation layer 131 and the tunnel insulation layer 133 may include silicon oxide layers. The data storage layer 132 may include a charge-trapping layer such as a silicon nitride layer, a silicon layer, a phase change layer, a nano-dot, a variable resistive layer including a metal oxide layer. The memory layer 135 may be formed in the hole H.

The channel layer 140 may be formed on a surface of the memory layer 135. The channel layer 140 may include a polysilicon layer doped with conductive impurities.

The connecting layer 142 may be positioned on a bottom surface of the hole H. The connection layer 142 may include a conductive layer epitaxially growing from the source layer 110. The connecting layer 142 may have a lower surface configured to make contact with the source layer 110, and a sidewall configured to make contact with the channel layer 140. Thus, the source layer 110 and the channel layer 140 may be electrically connected with each other through the connecting layer 142.

The core insulation layer 146 and the capping pattern 150 may be formed in the hole H. For example, the core insulation layer 146 may be formed in a great part of the hole H. The capping pattern 150 may be formed on the core insulation layer 146 in the hole H. The capping pattern 150 may include a polysilicon layer doped with impurities. The capping pattern 150 may be connected to the channel layer 140. The capping pattern 150 may be operated as a drain region of the drain selection transistor DST.

Although not depicted in drawings, the bit line may be formed on the capping pattern 150. The bit line may be extended in direction (y direction) substantially perpendicular to the gate lines SSL, WL1~WL4 and DSL.

Figure 3:
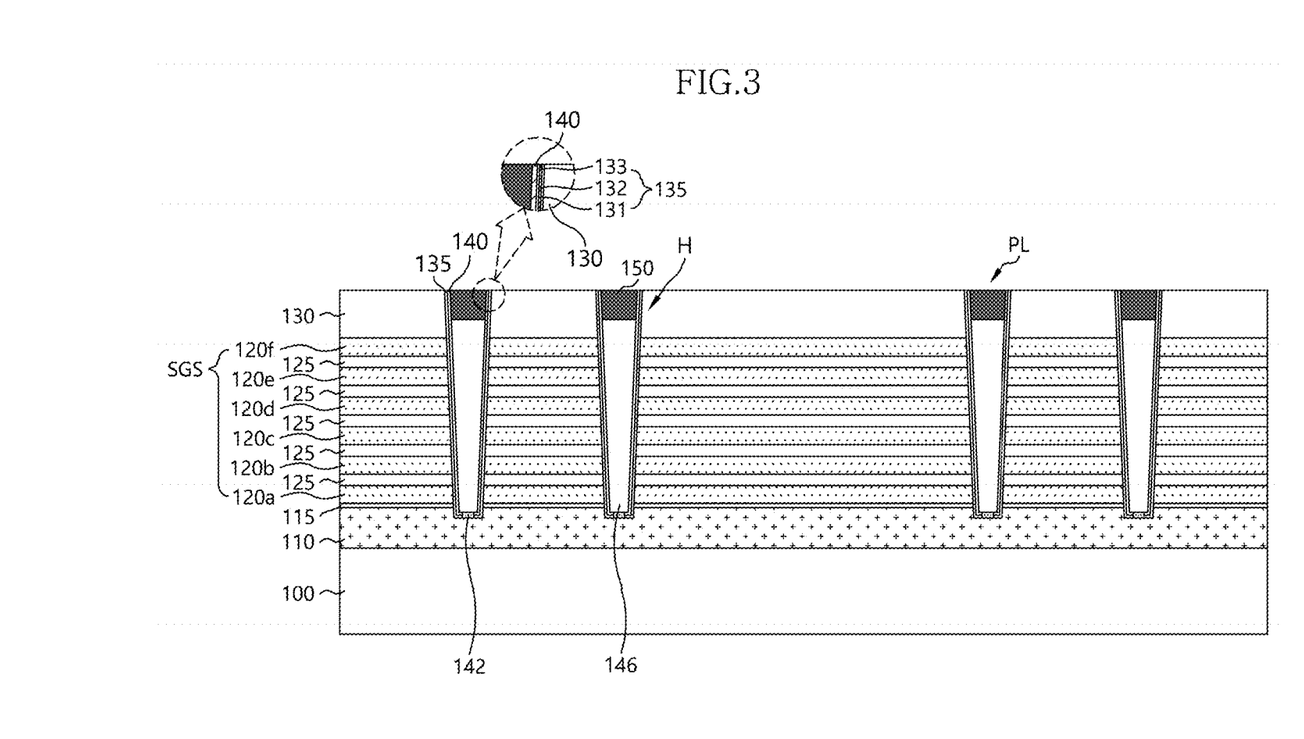
FIGS. 3, 4, 5, 6, 7, and 8 are cross-sectional views illustrating a method of manufacturing a non-volatile memory device in accordance with embodiments.

FIGS. 3 to 8 are cross-sectional views illustrating a method of manufacturing a non-volatile memory device in accordance with various embodiments. FIG. 3 shows a stack structure including a cell plug.

Referring to FIG. 3, a source layer 110 may be formed on a semiconductor substrate 100. The source layer 110 may correspond to an impurity region in the semiconductor substrate 100. The source layer 110 may be formed by implanting and activating n type impurities into the semiconductor substrate 100. The source layer 110 may correspond to the source line SL in FIG. 1.

A gate insulating layer 115 may be formed on the semiconductor substrate 100 with the source layer 110.

A stack structure SGS and an insulating interlayer 130 may be formed on the gate insulation layer 115. The stack structure SGS may be formed by alternately first layers 120a~120f and a second layer 125.

In various embodiments, the first layers 120a~120f may be a sacrificial layer having an etching selectivity different from that of the second layer 125. For example, when the second layer 125 may include a silicon oxide layer, the first layers 120a~120f may include a silicon nitride layer.

In various embodiments, the first layers 120a~120f may include conductive layers as gate lines.

A plurality of cell plugs PL may be formed in the insulating interlayer 130 and the stack structure SGS. Particularly, a hole H may be formed through the insulating interlayer 130 and the stack structure SGS to partially expose the source layer 110.

A memory layer 135 may be formed on an inner wall of the hole H. The memory layer 135 may be formed by forming a blocking insulation layer 131 on the inner wall of the hole H, forming a data storage layer 132 on the blocking insulation layer 131, and forming a tunnel insulation layer 133 on the data storage layer 132. The memory layer 135 may be planarized until an upper surface of the insulating interlayer 130 may be exposed so that the memory layer 135 may exist in the hole H.

A channel layer 140 may be formed on the memory layer 135. The channel layer 140 may be formed on the surface of the hole H where the insulating interlayer 130 and the memory layer 135 may be formed. The channel layer 140 may include a doped polysilicon layer with conductive impurities. The channel layer 140 may be planarized until the upper surface of the insulating interlayer 130 may be exposed so that the channel layer 140 may exist in the hole H.

The channel layer 140 and the memory layer 135 in a lower region of the hole H may be etched to form an opening configured to expose the source layer 110 on the bottom surface of the hole H. The channel layer 140 and the memory layer 135 as well as the source layer 110 may be partially exposed through the opening. The exposed source layer 110 may epitaxially grow to form a connecting layer 142 including an epitaxial silicon layer in the opening. Thus, the connecting layer 142 may be configured to connect the source layer 110 with the channel layer 140.

A core insulation layer 146 may be formed in the hole H in which the connecting layer 142 may be formed. The core insulation layer 146 may include perhydropolysilazane-based inorganic spin-on dielectric (PSZ-SOD) having good gap-filling characteristic. The core insulation layer 146 may be planarized to be positioned the core insulation layer 146 in the hole H.

The core insulation layer 146 may be etched to provide the core insulation layer 146 with a thickness less than a height of the hole H. Thus, a first recess may be formed in the core insulation layer 146. A conductive layer may be formed in the first recess. The conductive layer may include a polysilicon layer doped with conductive impurities. The conductive layer in the first recess may be planarized to form a capping pattern 150. In an embodiment, the capping pattern 150 may include a conductive material.

Figure 4:
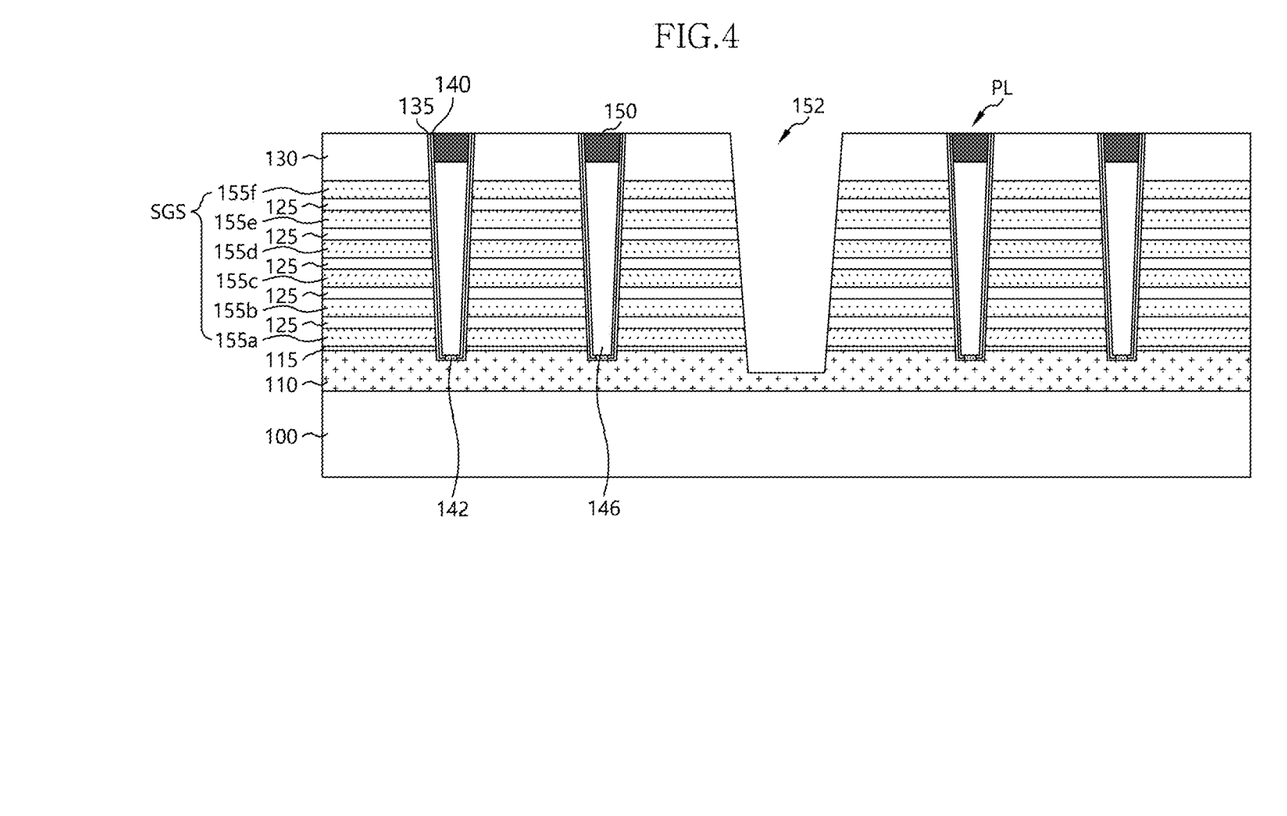

Referring to FIG. 4, a slit 152 may be formed through the insulating interlayer 130 and the stack structure SGS. The slit 152 may correspond to a region configured to divide the memory cell array 10 into the blocks. The slit 152 may have a depth and a width greater than those of the hole H for defining the cell plug PL. The insulating interlayer 130 and the stack structure SGS may be exposed through a sidewall of the slit 152.

In various embodiments, when the first layers 120a~120f may include the sacrificial layer, gate lines 155a~155f may be rearranged after forming the slit 152.

For example, when the first layers 120a~120f may include the sacrificial layer such as the silicon nitride layer, the first layers 120a~120f may be selectively removed through the sidewall of the slit 152. A conductive layer may be formed in a space generated by removing the first layers 120a~120f to rearrange the gate lines 155a~155f of the memory string.

Figure 5:
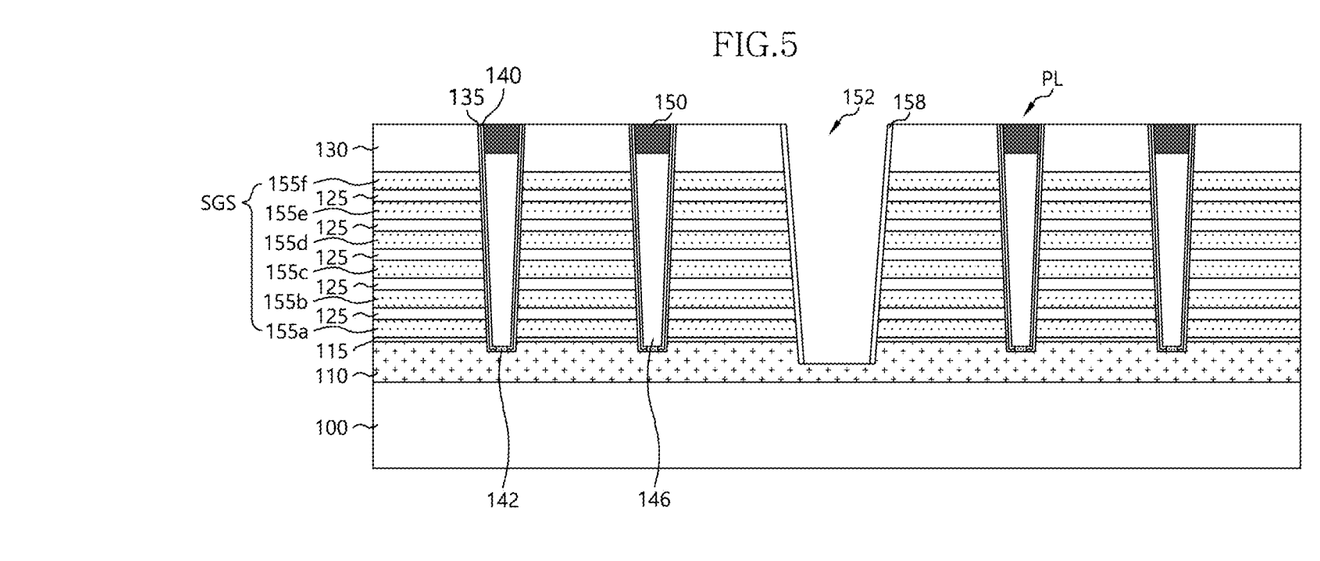

Referring to FIG. 5, a sealing layer 158 may be formed on the inner wall of the slit 152 to block the stack structure SGS exposed through the slit 152. The sealing layer 158 may function as to insulate the gate lines 155a-155f of the stack structure SGS from a source contact line formed later. The sealing layer 158 may include a silicon oxide layer. The sealing layer 158 may be planarized until the upper surface of the insulating interlayer 130 may be exposed. The sealing layer 158 may be etched until the bottom surface of the slit 152, i.e., the source layer 110 may be exposed. Thus, the side wall of the slit 152 may be blocked by the sealing layer 158. In contrast, the source layer 110 on the bottom surface of the slit 152 may be exposed.

Figure 6:
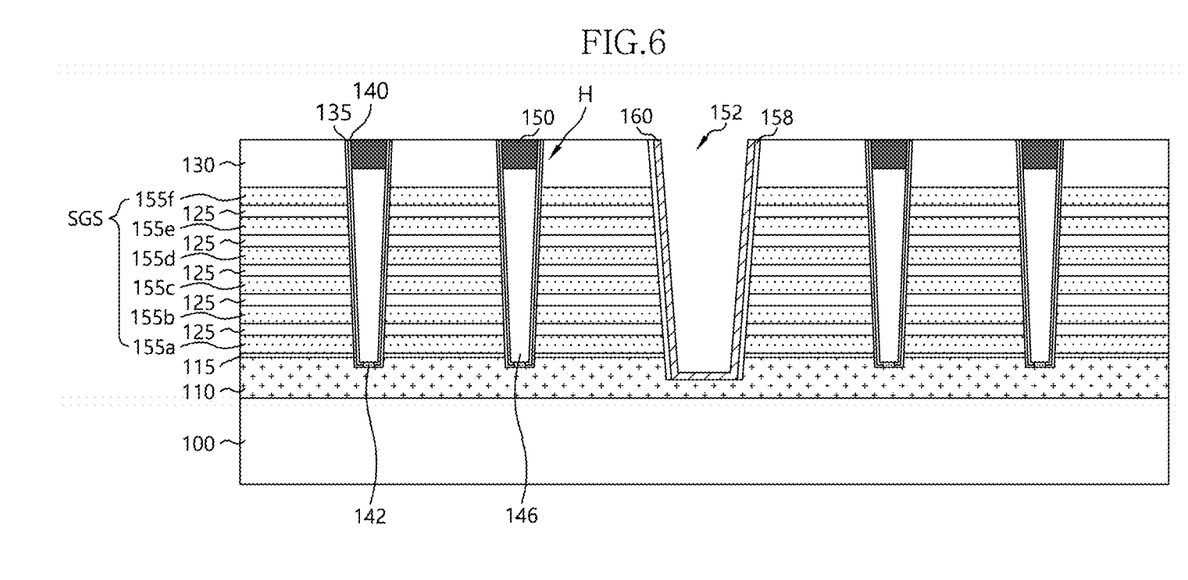

Referring to FIG. 6, a source liner 160 may be formed on a surface of the sealing layer 158 and the bottom surface of the slit 152. The source liner 160 may include a conductive layer. For example, the source liner 160 may include a metal nitride layer. The source liner 160 may be formed by an atomic layer deposition (ALD) process, a plasma-enhanced ALD (PEALD) process, etc. The source liner 160 may be planarized until the upper surface of the insulating interlayer 130 may be exposed. Thus, source liner 160 may directly make contact with the source layer 110.

Figure 7:
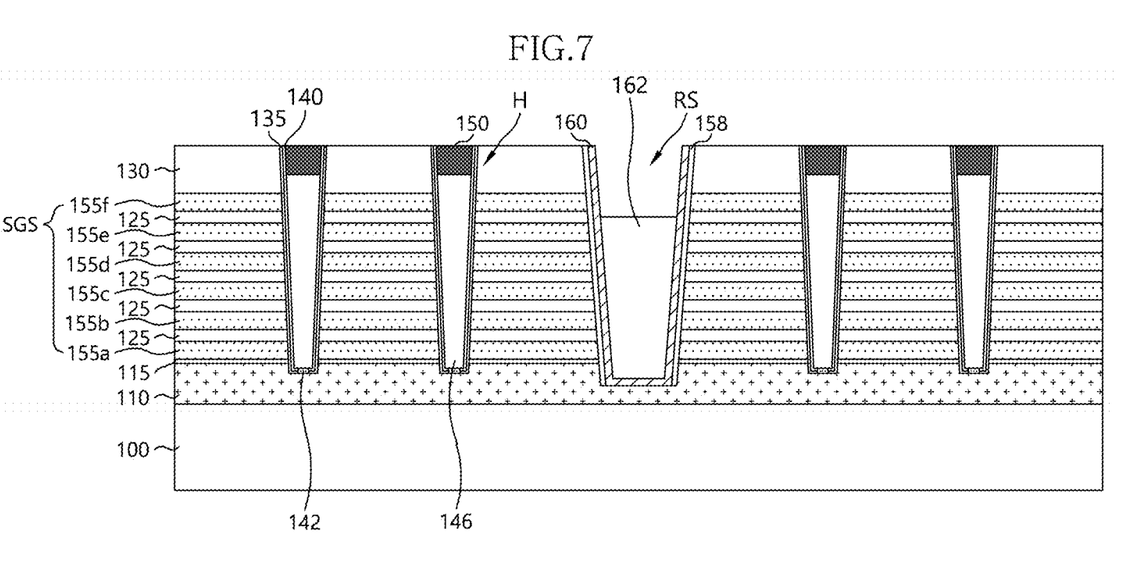

Referring to FIG. 7, a gap-filling layer 162 may be formed on the source liner 160 to fill up the slit 152 with the gap-filling layer 162. The gap-filling layer 162 may include a silicon oxide layer. The gap-filling layer 162 may include an insulation material substantially the same as that of the core insulation layer 146. The gap-filling layer 162 may be planarized until the upper surface of the insulating interlayer 130 may be exposed. The gap-filling layer 162 may be etched to provide the gap-filling layer 162 in the slit 152 with a thickness less than the height of the slit 152. Thus, a second recess RS may be formed in the gap-filling layer 162. The source liner 160 on both sidewalls of the slit 152 may be exposed through the second recess RS.

Figure 8:
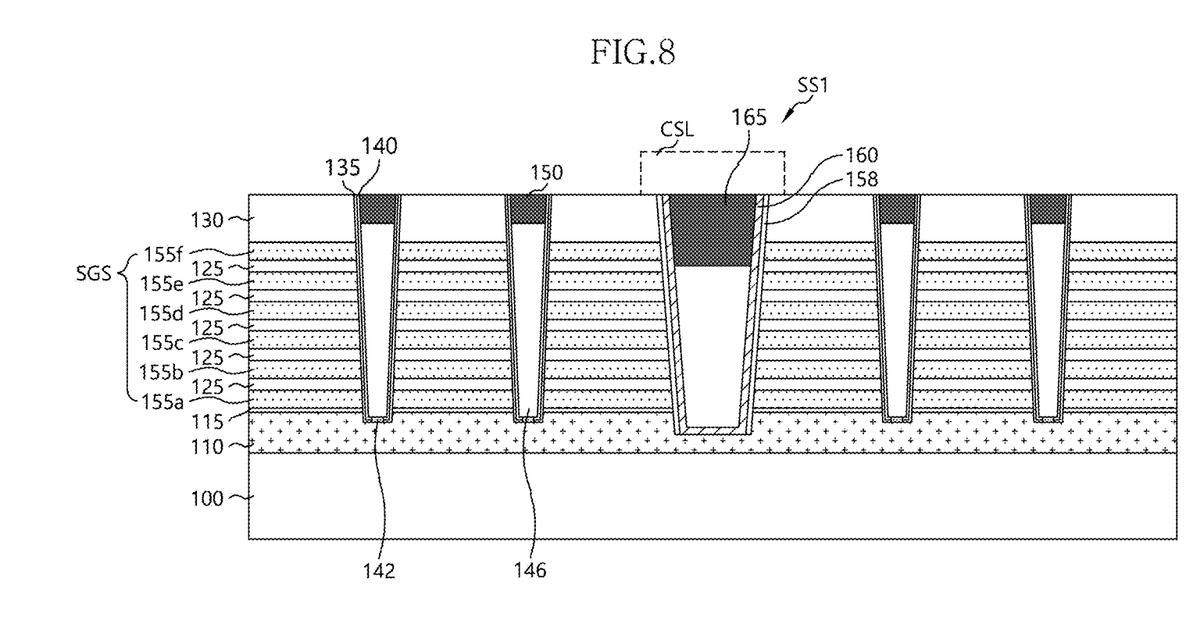

Referring to FIG. 8, a source contact pattern 165 may be formed in the second recess RS to form a source structure SS1. The source contact pattern 165 may be formed by forming a conductive layer and by planarizing the conductive layer. The conductive layer of the source contact pattern 165 may include a tungsten layer having good gap-filling characteristic and good conductivity. The tungsten layer may be formed using a source gas such as a WF6 gas. The conductive layer may be planarized by a chemical mechanical polishing (CMP) process.

In various embodiments, the source liner 160 and the conductive layer of the source contact pattern 165 may be separately planarized. Alternatively, during planarizing the conductive layer of the source contact pattern 165, the source liner 160 and the sealing layer 158 may be simultaneously planarized.

A common source line CSL may then be formed on the source contact pattern 165.

In various embodiments, when the polysilicon plug may be formed in the slit 152, a silicide layer may be formed at a contact portion between the polysilicon plug and the source contact pattern for an ohmic contact.

A void may be generated in a relatively great amount of portion of the polysilicon plug removed in forming the silicide layer, for example, a thin portion of the polysilicon plug. The void may function as a passageway through which the WF6 gas may be introduced into the sealing layer 158 in forming the metal layer of the source contact pattern 165 such as the tungsten layer. The WF6 gas reaching to the sealing layer 158 through the void may be reacted with a hydrogen ion in the sealing layer 158 to generate HF byproducts. The HF byproducts may remove silicon oxide in the sealing layer 158 to cause loss of the sealing layer 158. As a result, the tungsten layer in the lost portion of the sealing layer 158 may function as a bridge between the gate lines 155a~155f of the stack structure SGS and the source contact pattern 165 to generate a leakage current.

However, according to various embodiments, the source liner 160 may be formed on the sealing layer 158 and the gap-filling layer 162 in place of the polysilicon plug may be interposed between the sealing layer 158 and the source liner 160. Thus, the silicide layer might not be generated to prevent the void from being generated. As a result, the bridge might not be generated in the sealing layer 158. Particularly, because metal nitride in the source liner 160 might not be reacted with the source gas for forming the source contact pattern 165, the source gas might not diffuse into the sealing layer 158.

Figure 9:
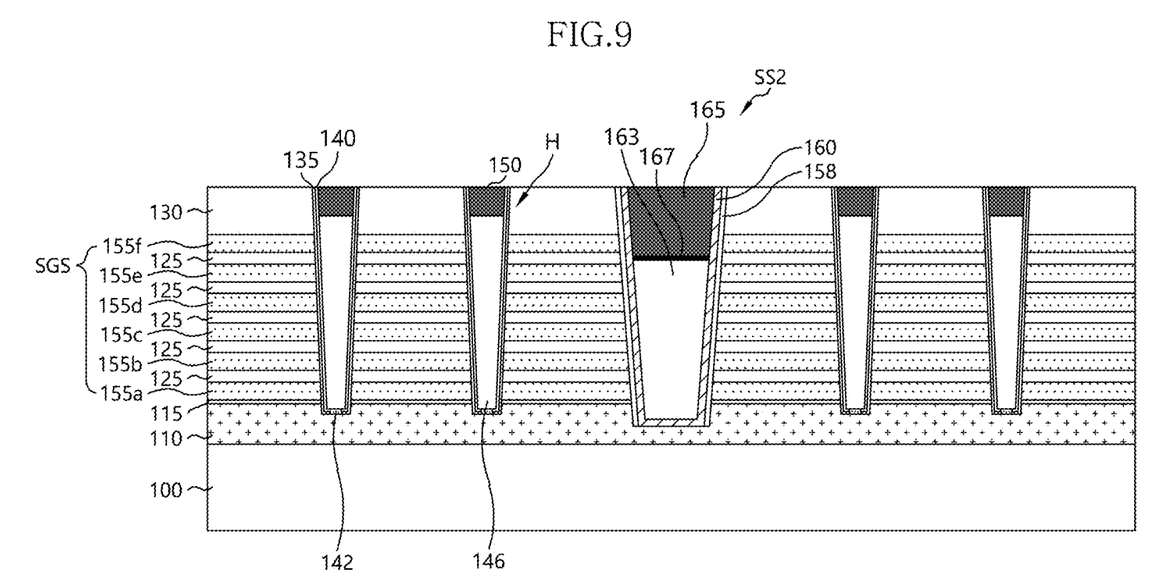
FIG. 9 is a cross-sectional view illustrating a method of manufacturing a non-volatile memory device in accordance with embodiments.

FIG. 9 is a cross-sectional view illustrating a method of manufacturing a non-volatile memory device in accordance with various embodiments. The method of various embodiments may include processes substantially the same as those illustrated with reference to FIGS. 3 to 8. Thus, a process after forming the source liner 160 may be illustrated.

Referring to FIG. 9, a polysilicon layer 163 as a gap-filling layer may be formed on the source liner 160 to fill up the slit 152 with the polysilicon layer 163. The polysilicon layer 162 may be planarized until the upper surface of the insulating interlayer 130 may be exposed to form a conductive gap-filling layer 162 in the slit 152. The conductive gap-filling layer 162 may be etched to form a second recess. A tungsten layer may be formed in the second recess to form the source contact pattern 165.

In various embodiments, when the conductive gap-filling layer 163 may be formed in the slit 152, the silicide layer 167 may be formed between the conductive gap-filling layer 163 and the source contact pattern 165. Further, a void may be generated in a weak portion of the conductive gap-filling layer 163 in forming the silicide layer. However, because the source liner 160 including metal nitride might not participate in the silicide reaction, the void might not be generated in the source liner 160. As a result, the void might not be generated in the sealing layer 158 as well as the source liner 160 to block the diffusion of the source gas by the source liner 160. Therefore, the bridge might not be generated in the sealing layer.

According to various embodiments, the source liner including metal nitride may be formed on the sealing layer in the slit. Thus, the sealing layer may be protected during forming the source contact pattern to prevent the bridge from being generated. As a result, the source contact pattern and the source line region may be electrically connected with each other.

The above described embodiments are intended to illustrate and not to limit the present disclosure. Various alternatives and equivalents are possible. The embodiments are not limited by the embodiments described herein. Nor are the embodiments limited to any specific type of semiconductor device. Another additions, subtractions, or modifications are obvious in view of the present disclosure and are intended to fall within the scope of the appended claims.

What is claimed is:

1. A method of manufacturing a non-volatile memory device, the method comprising:
    forming a stack structure on the semiconductor substrate with a source line region;
    forming a slit through the stack structure;
    forming a sealing layer on an inner wall of the slit;
    forming a source liner including a conductive layer on a surface of the sealing layer and a bottom surface of the slit to contact the source line region with the source liner;
    forming a gap-filling layer including an insulating material in the slit; and
    forming a source contact pattern on the gap-filing layer in the slit.

2. The method of claim 1, wherein forming the sealing layer comprises:
    forming an insulation layer on a surface of the slit; and
    etching the sealing layer to expose the source line region on the bottom surface of the slit.

3. The method of claim 1, wherein forming the source liner comprises forming a metal nitride layer on the surface of the sealing layer and the bottom surface of the slit.

4. The method of claim 3, wherein the source liner is formed by an atomic layer deposition (ALD) process.

5. The method of claim 1, wherein forming the gap-filling layer comprises:
    forming the gap-filling layer in the slit;
    planarizing the gap-filling layer to form the gap-filling layer in the slit; and
    etching the gap-filling layer until a thickness of the gap-filling layer is lower than a height of the slit to form a recess in the gap-filling layer, wherein the source liner on the inner wall of the slit is exposed through the recess.

6. The method of claim 5, wherein forming the source contact pattern comprises:
   contacting a metal layer with the exposed source liner to fill the recess with the metal layer; and
   planarizing the metal layer to form the metal layer in the recess.

7. The method of claim 1, wherein forming the stack structure comprises alternately stacking gate lines and insulation layers.

8. The method of claim 1, further comprising:
   forming a hole through the stack structure;
   forming a memory layer on an inner wall of the hole;
   forming a channel layer on the memory layer;
   forming a core insulation layer in the hole; and
   forming a capping pattern on the core insulation layer in the hole to connect the capping pattern with the channel layer.

* * * * *